US 9,525,382 B2

(12) United States Patent
Yagi (10) Patent No.: US 9,525,382 B2
(45) Date of Patent: Dec. 20, 2016

(54) OSCILLATION CIRCUIT

(71) Applicant: LAPIS SEMICONDUCTOR CO., LTD., Kanagawa (JP)

(72) Inventor: Katsuyoshi Yagi, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 14/994,218

(22) Filed: Jan. 13, 2016

(65) Prior Publication Data

US 2016/0211802 A1 Jul. 21, 2016

(30) Foreign Application Priority Data

Jan. 15, 2015 (JP) .................................. 2015-005803

(51) Int. Cl.

| H03B 5/04 | (2006.01) |
|---|---|
| H03K 3/011 | (2006.01) |
| H03K 3/0231 | (2006.01) |
| H03L 1/00 | (2006.01) |
| H03B 5/24 | (2006.01) |

(52) U.S. Cl.
CPC ............ *H03B 5/24* (2013.01); *H03B 5/04* (2013.01); *H03K 3/011* (2013.01); *H03K 3/0231* (2013.01); *H03L 1/00* (2013.01)

(58) Field of Classification Search
CPC ......... H03B 5/04; H03K 3/011; H03K 3/0231; H03K 4/12; H03K 4/50; H03L 1/00; H03L 5/00; H03L 5/02
USPC ........ 331/111, 143, 153, 182, 183, 185, 186
See application file for complete search history.

(56) References Cited

U.S. PATENT DOCUMENTS

| 4,064,468 A | * | 12/1977 | Kumata | ................... G04F 5/06 331/116 FE |
|---|---|---|---|---|
| 4,146,849 A | * | 3/1979 | Satou | ...................... H03K 7/06 331/108 D |
| 4,853,654 A | * | 8/1989 | Sakurai | .................. H03K 3/354 331/175 |
| 5,544,120 A | * | 8/1996 | Kuwagata | ............. G11C 11/406 331/175 |
| 7,015,766 B1 | * | 3/2006 | Guo | ....................... H03K 5/133 331/176 |

(Continued)

FOREIGN PATENT DOCUMENTS

JP H06-045830 A 2/1994

*Primary Examiner* — Levi Gannon
(74) *Attorney, Agent, or Firm* — Kubotera & Associates, LLC (57) ABSTRACT

An oscillation circuit includes an electrical current generating portion configured to generate an electrical current having an oscillation frequency decreasing as an amplitude thereof is decreased; a control voltage generating portion configured to generate a control voltage having a magnitude decreasing as a magnitude of a power source voltage is decreased; and an electrical current control portion. The electrical current control portion includes a first input terminal connected to the control voltage generating portion for receiving the electrical current; a control terminal connected to the control voltage generating portion for receiving the control voltage; and a first output terminal. The electrical current control portion is configured to reduce the amplitude of the electrical current flowing between the first input terminal and the first output terminal as the magnitude of the control voltage is decreased.

10 Claims, 10 Drawing Sheets

(56) References Cited

U.S. PATENT DOCUMENTS

2004/0036545 A1\* 2/2004 Chung .................... H03B 5/04
                                                                                 331/135
2004/0108521 A1\* 6/2004 Lim ...................... G11C 11/406
                                                                                 257/200

\* cited by examiner

OSCILLATION CIRCUIT

BACKGROUND OF THE INVENTION AND RELATED ART STATEMENT

The present invention relates to an oscillation circuit.

A conventional oscillation circuit may include an inverter formed of a MOS (Metal Oxide Semiconductor) transistor.

Patent Reference has disclosed an example of the conventional oscillation circuit. According to Patent Reference, the conventional oscillation circuit includes the inverter formed of a first P-channel MOS transistor and a first N-channel MOS transistor. Further, the conventional oscillation circuit includes a crystal oscillator connected between an input terminal and an output terminal of the inverter. Further, a second P-channel MOS transistor and a second N-channel MOS transistor are connected in series to a power source side and a ground side of the inverter, respectively.

Patent Reference: Japanese Patent Publication No. 06-45830

According to Patent Reference, the conventional oscillation circuit further includes a voltage adjusting circuit for adjusting a power source voltage. The voltage adjusting circuit is formed of a third MOS transistor and a resistor. The voltage adjusting circuit is connected to gates of the second P-channel MOS transistor and the second N-channel MOS transistor on the power source side and the ground side of the inverter, respectively. With the configuration as described above, the conventional oscillation circuit is capable of widening a selection range of a frequency that can be used relative to a voltage range of the conventional oscillation circuit.

The conventional oscillation circuit disclosed in Patent Reference may be combined with a functional circuit to constitute a system, so that the functional circuit operates according to an output signal of the conventional oscillation circuit as a clock signal. In this case, when the power source voltage to be supplied to the functional circuit is decreased, an operational speed of the functional circuit may be decreased. If this happens, the functional circuit is not able to operate in synchronization with the clock signal, thereby causing an operational problem.

In order to prevent the functional circuit from causing the operational problem when the power source voltage is decreased, it may be configured such that a frequency of the output signal of the conventional oscillation circuit is divided when the power source voltage is decreased. However, in this case, if the start timing of the frequency division is delayed, it is difficult to prevent the functional circuit from causing the operational problem.

In view of the problems of the conventional oscillation circuit described above, an object of the present invention is to provide an oscillation circuit capable of preventing a functional circuit from causing the operational problem when the oscillation circuit is provided for supplying a clock signal to the functional circuit, even if the functional circuit tends to delay in following the clock signal when the power source voltage is decreased.

Further objects and advantages of the invention will be apparent from the following description of the invention.

SUMMARY OF THE INVENTION

In order to attain the objects described above, according to a first aspect of the present invention, an oscillation circuit includes an electrical current generating portion; a control voltage generating portion; and an electrical current control portion.

According to the first aspect of the present invention, the electrical current generating portion is configured to generate an electrical current whose oscillation frequency is decreased as an amplitude thereof is decreased. Further, the control voltage generating portion is configured to generate a control voltage whose magnitude is decreased as a magnitude of a power source voltage is decreased.

According to the first aspect of the present invention, the electrical current control portion includes an input terminal connected to the control voltage generating portion for receiving the electrical current; a control terminal connected to the control voltage generating portion for receiving the control voltage; and an output terminal. Further, the electrical current control portion is configured to reduce the amplitude of the electrical current flowing between the input terminal and the output terminal as the magnitude of the control voltage is decreased.

According to a second aspect of the present invention, an oscillation circuit includes a first P-MOS transistor; a first N-MOS transistor; a second N-MOS transistor; and a control voltage generating portion.

According to the second aspect of the present invention, the first P-MOS transistor includes a source connected to a power source line. The first N-MOS transistor includes a drain connected to a drain of the first P-MOS transistor, and a gate connected to a gate of the first P-MOS transistor. The second N-MOS transistor includes a drain connected to a source of the first N-MOS transistor, and a source connected to a ground line. Further, the electrical current control portion is configured to supply a control voltage to a gate of the second N-MOS transistor. A magnitude of the control voltage is reduced as a magnitude of a power source voltage supplied between the power source line and the ground line is decreased.

According to the present invention, it is possible to provide the oscillation circuit capable of preventing a functional circuit from causing an operational problem when the oscillation circuit is provided for supplying a clock signal to the functional circuit, even if the functional circuit tends to delay in following the clock signal when the power source voltage is decreased.

DETAILED DESCRIPTION OF PREFERRED EMBODIMENTS

Hereunder, preferred embodiments of the present invention will be explained with reference to the accompanying drawings. In the following description, a same component or a corresponding component is designated with a same reference number in the accompanying drawings.

First Embodiment

Figure 1:
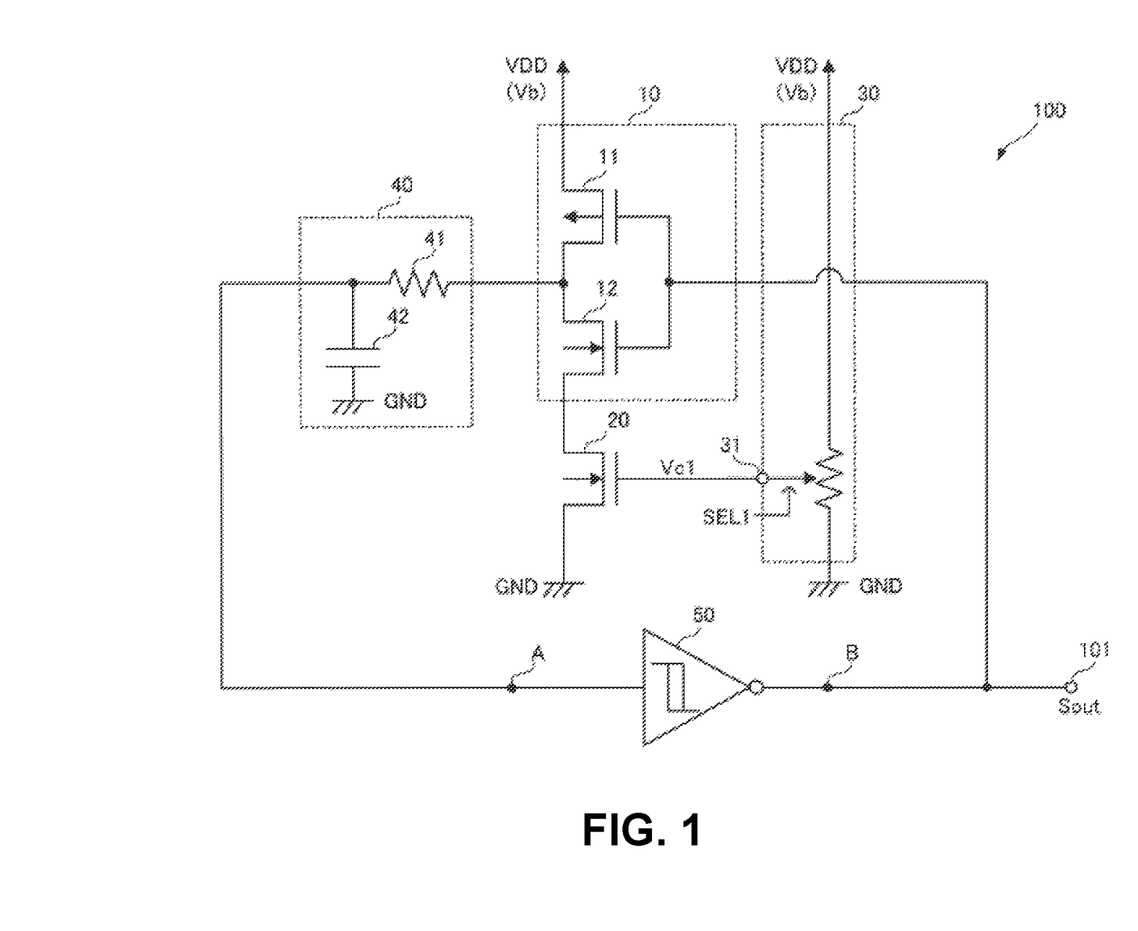
FIG. 1 is a circuit diagram showing a configuration of an oscillation circuit according to a first embodiment of the present invention.

A first embodiment of the present invention will be explained. FIG. 1 is a circuit diagram showing a configuration of an oscillation circuit 100 according to the first embodiment of the present invention.

As shown in FIG. 1, the oscillation circuit 100 includes an inverter 10; an N-MOS transistor 20; a control voltage generating circuit 30; an RC circuit 40; and a Schmitt trigger circuit 50.

In the first embodiment, each component of the oscillation circuit 100 may be formed in one single semiconductor chip. It should be noted that the present invention is not limited to the structure, and each component of the oscillation circuit 100 may be formed in different semiconductor chips. Further, it should be noted that the RC circuit 40 may be formed of a discrete component.

In the first embodiment, the inverter 10 includes a P-MOS transistor 11 and an N-MOS transistor 12 connected in series. The P-MOS transistor 11 has a source connected to a power source line VDD; a drain connected to a drain of the N-MOS transistor 12 and one end portion of a resistor element 41 that constitutes the RC circuit 40; and a gate connected to a gate of the N-MOS transistor 12. The N-MOS transistor 12 has a source connected to the drain of the P-MOS transistor 11. It should be noted that the gate of the P-MOS transistor 11 and the gate of the N-MOS transistor 12 correspond to an input terminal of the inverter 10. Further, the drain of the P-MOS transistor 11 and the drain of the N-MOS transistor 12 correspond to an output terminal of the inverter 10.

In the first embodiment, the N-MOS transistor 20 has a gate connected to a ground line GND and a gate connected to an output terminal 31 of the control voltage generating circuit 30.

In the first embodiment, the RC circuit 40 is formed of the resistor element 41 and a capacitor 42. The resistor element 41 has one end portion connected to the output terminal of the inverter 10 (the drain of the P-MOS transistor 11 and the drain of the N-MOS transistor 12), and the other end portion connected to one end portion of the capacitor 42 and an input terminal of the Schmitt trigger circuit 50. The other end portion of the capacitor 42 is connected to the ground line GND.

In the first embodiment, the Schmitt trigger circuit 50 is configured such that an output voltage thereof changes with a hysteresis property relative to a change in an input voltage input into the input terminal thereof. More specifically, while the Schmitt trigger circuit 50 outputs the output voltage with a low level (a ground level) from the output terminal thereof, when the input voltage changing in an incremental direction and input into the input terminal thereof exceeds a threshold voltage Vth1, the Schmitt trigger circuit 50 changes the level of the output voltage to a high level (a power source voltage level). On the other hand, while the Schmitt trigger circuit 50 outputs the output voltage with the high level from the output terminal thereof, when the input voltage changing in a decremental direction and input into the input terminal thereof reaches a threshold voltage Vth2 (Vth2<Vth1), the Schmitt trigger circuit 50 changes the level of the output voltage to the low level.

In the first embodiment, the output terminal of the Schmitt trigger circuit 50 is connected to the input terminal of the inverter 10 (the gate of the P-MOS transistor 11 and the gate of the N-MOS transistor 12) and an output terminal 101 of the oscillation circuit 100.

In the first embodiment, the control voltage generating circuit 30 is configured to generate a control voltage Vc1 having a magnitude corresponding to a power source voltage Vb supplied between the power source line VDD and the ground line GND. Further, the control voltage generating circuit 30 is configured to output and supply the control voltage Vc1 to the gate of the N-MOS transistor 20 through the output terminal 31.

More specifically, the control voltage generating circuit 30 includes a voltage dividing circuit 32 formed of a plurality of resistor elements (described later, refer to FIG. 2). The voltage dividing circuit 32 is configured to divide the power source voltage Vb, so that the control voltage generating circuit 30 generates the divided voltage as the control voltage Vc1. It should be noted that a selection signal SEL1 is supplied externally to the control voltage generating circuit 30, so that the control voltage generating circuit 30 can adjust a voltage division ratio for dividing the power source voltage Vb.

Figure 2:
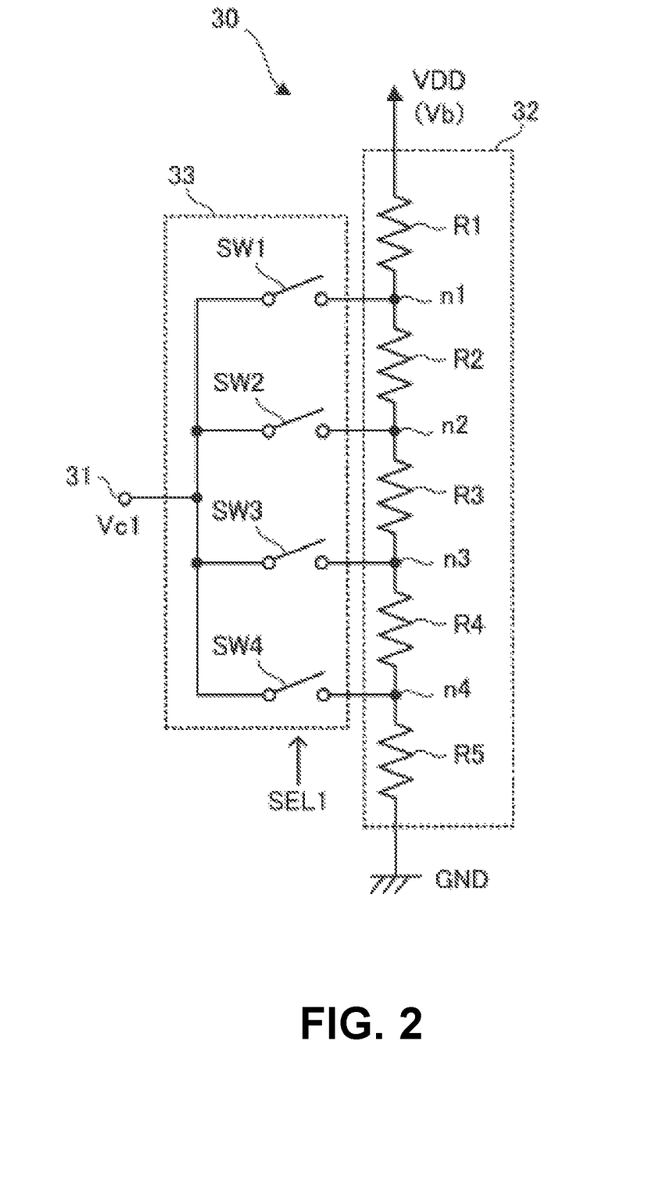
FIG. 2 is a circuit diagram showing a configuration of a control voltage generating circuit of the oscillation circuit according to the first embodiment of the present invention.

FIG. 2 is a circuit diagram showing a configuration of the control voltage generating circuit 30 of the oscillation circuit 100 according to the first embodiment of the present invention.

As shown in FIG. 2, the control voltage generating circuit 30 includes the voltage dividing circuit 32 disposed between the power source line VDD and the ground line GND. The voltage dividing circuit 32 formed of a plurality of resistor elements R1 to R5 connected in series. Further, the control voltage generating circuit 30 includes a selection circuit 33. The selection circuit 33 is configured to selectively connect one of connection points n1 to n4 connecting between the resistor elements R1 to R5 to the gate of the N-MOS transistor 20 through the output terminal 31 according to the selection signal SEL1 supplied externally.

In the first embodiment, the selection circuit 33 is formed of switches SW1, SW2, SW3, and SW4. One end portion of the switch SW1 is connected to the connection point n1 between the resistor element R1 and the resistor element R2, and one end portion of the switch SW2 is connected to the connection point n2 between the resistor element R2 and the resistor element R3. Similarly, one end portion of the switch SW3 is connected to the connection point n3 between the resistor element R3 and the resistor element R4, and one end portion of the switch SW4 is connected to the connection point n4 between the resistor element R4 and the resistor element R5. The other end portions of the switches SW1, SW2, SW3, and SW4 are connected to the gate of the N-MOS transistor 20 through the output terminal 31 of the control voltage generating circuit 30.

In the first embodiment, it is configured such that one of the switches SW1, SW2, SW3, and SW4 is turned on according to the selection signal SEL1. Accordingly, a voltage generated at one of the connection points n1 to n4 is supplied to the gate of the N-MOS transistor 20 as the control voltage Vc1 through the output terminal 31. For example, when the switch SW3 is turned on according to the selection signal SEL1, the voltage generated at the connection point n3 between the resistor element R3 and the resistor element R4 is supplied to the gate of the N-MOS transistor 20 as the control voltage Vc1. It should be noted that the control voltage Vc1 is the voltage obtained through dividing the power source voltage Vb1 at the voltage division ratio determined according to the selection signal SEM. In the first embodiment, it is possible to change the voltage division ratio at four stages with the control voltage generating circuit 30, and it may be configured so that the voltage division ratio can be changed at an arbitrary number of stages.

In the first embodiment, the oscillation circuit 100 is one example of an oscillation circuit of the present invention. Further, the inverter 10 is one example of an electrical current generating portion of the present invention. Further, the N-MOS transistor 20 is one example of an electrical current control portion of the present invention. Further, the control voltage Vc1 is one example of a control voltage of the present invention. Further, the control voltage generating circuit 30 is one example of a control voltage generating portion of the present invention. Further, the resistor elements R1 to R5 are one example of a plurality of resistor elements of the present invention. Further, the selection circuit 33 is one example of a first selection circuit of the present invention. Further, the RC circuit 40 is one example of an RC circuit of the present invention. Further, the Schmitt trigger circuit 50 is one example of a Schmitt trigger circuit of the present invention.

An operation of the oscillation circuit 100 will be explained next. In the first embodiment, as described above, when the oscillation circuit 100 is operating, one of the switches SW1 to SW4 is turned on, so that the voltage generated at one of the connection points n1 to n4 is supplied to the gate of the N-MOS transistor 20 as the control voltage Vc1.

Figure 3:
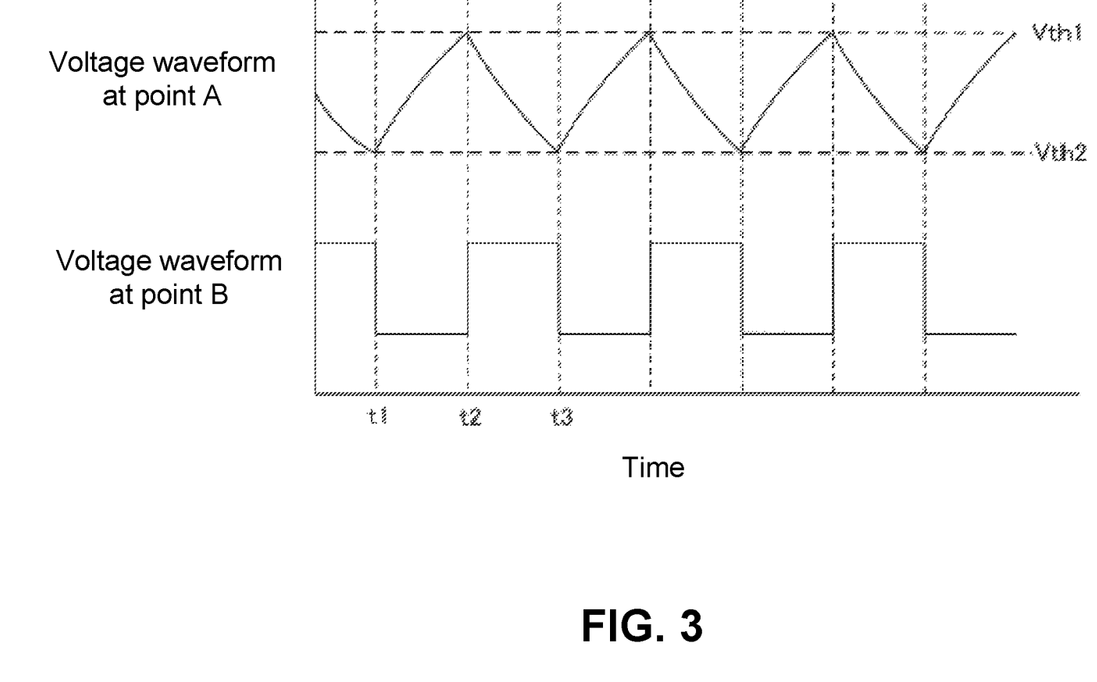
FIG. 3 is a time chart showing a wave shape of a voltage at a point A and a wave shape of a voltage at a point B of the oscillation circuit according to the first embodiment of the present invention.

FIG. 3 is a time chart showing a wave shape of a voltage at a point A and a wave shape of a voltage at a point B of the oscillation circuit 100 according to the first embodiment of the present invention. It should be noted that the point A corresponds to the input terminal of the Schmitt trigger circuit 50, and the point B corresponds to the output terminal of the Schmitt trigger circuit 50.

As shown in FIG. 3, at a timing t1, when the voltage with the low level (the ground level) is output from the output terminal (the pint B) of the Schmitt trigger circuit 50, the N-MOS transistor 12 of the inverter 10 is turned off, and the P-MOS transistor 11 of the inverter 10 is turned on. As a result, a charging electrical current flows from the power source line VDD to the capacitor 42 through the P-MOS transistor 11 and the resistor element 41. When the capacitor 42 is charged, a potential at the input terminal (the point A) of the Schmitt trigger circuit 50 is increased with time.

At a timing t2, when the potential at the input terminal (the point A) of the Schmitt trigger circuit 50 reaches the threshold voltage Vth1, the potential at the output terminal (the point B) of the Schmitt trigger circuit 50 is reversed to become the high level (the power source voltage level). Accordingly, the N-MOS transistor 12 of the inverter 10 is turned on, and the P-MOS transistor 11 of the inverter 10 is turned off. As a result, a discharging electrical current flows from the capacitor 42 to the ground line GND through the resistor element 41, the N-MOS transistor 12, and the N-MOS transistor 20. When the capacitor 42 is discharged, the potential at the input terminal (the point A) of the Schmitt trigger circuit 50 is decreased with time.

At a timing t3, when the potential at the input terminal (the point A) of the Schmitt trigger circuit 50 reaches the threshold voltage Vth2, the potential at the output terminal (the point B) of the Schmitt trigger circuit 50 is reversed to become the low level (the ground level). Accordingly, the N-MOS transistor 12 of the inverter 10 is turned off, and the P-MOS transistor 11 of the inverter 10 is turned on. When the process described above is repeated, the oscillation circuit 100 outputs an output signal Sout from an output terminal 101 thereof such that the output signal Sout becomes an oscillation state, in which the voltage with the high level and the voltage with the low level are appearing alternately.

In the first embodiment, the output signal Sout output from the oscillation circuit 100 has an oscillation frequency f determined by a charging time of the capacitor 42 (a period of time from the timing t1 to the timing t2) and a discharging time of the capacitor 42 (a period of time from the timing t2 to the timing t3). The discharging time of the capacitor 42 is prolonged as the discharging electrical current flowing from the capacitor 42 to the ground line GND through the resistor element 41, the N-MOS transistor 12, and the N-MOS transistor 20 is decreased. In other words, the oscillation frequency f of the output signal Sout output from the oscillation circuit 100 is decreased as the discharging time of the capacitor 42 is decreased.

In the first embodiment, the electrical current flowing to the N-MOS transistor 20, that is, the discharging electrical current, is decreased as the magnitude of the control voltage Vc1 is decreased. In other words, the N-MOS transistor 20 is configured to function as the electrical current control portion for controlling the electrical current flowing between the drain and the source thereof according to the magnitude of the control voltage Vc1.

As described above, the control voltage Vc1 is the voltage obtained through dividing the power source voltage Vb. Accordingly, the magnitude of the control voltage Vc1 is decreased as the magnitude of the power source voltage Vb is decreased. As a result, the electrical current flowing to the N-MOS transistor 20, that is, the discharging electrical current, is decreased as the magnitude of the power source voltage Vb is decreased. Therefore, the oscillation frequency f of the output signal Sout output from the oscillation circuit 100 is decreased as the magnitude of the power source voltage Vb is decreased.

Figure 4:
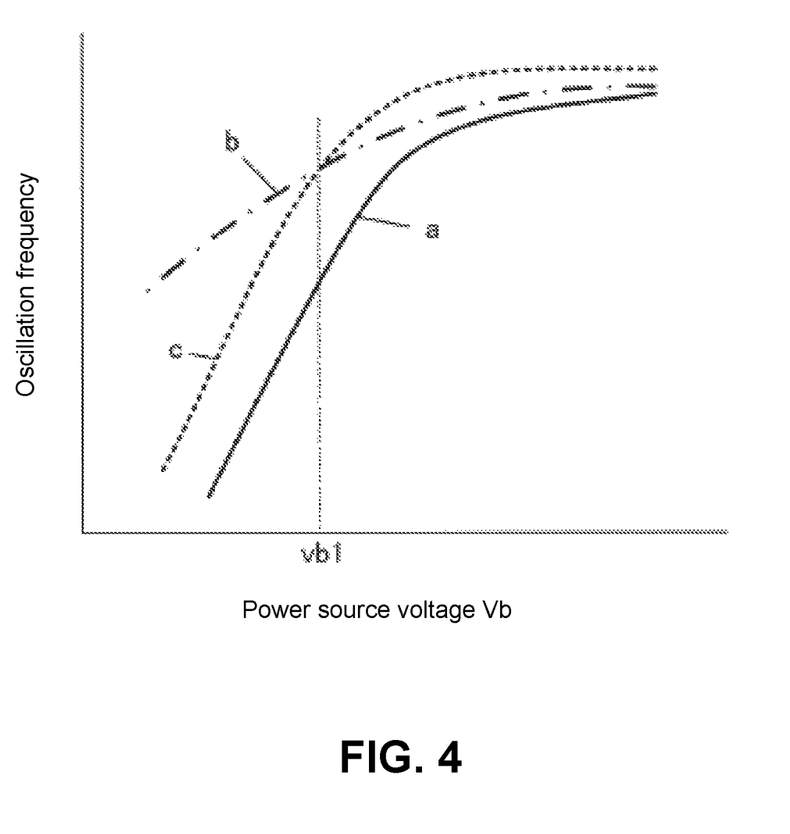
FIG. 4 is a graph showing a relationship between an oscillation frequency and a power source voltage of the oscillation circuit according to the first embodiment of the present invention.

FIG. 4 is a graph showing a relationship between the oscillation frequency f and the power source voltage Vb of the oscillation circuit 100 according to the first embodiment of the present invention.

In FIG. 4, a curve "a" represents the relationship between the oscillation frequency f and the power source voltage Vb of the oscillation circuit 100. Further, a curve "b" represents the relationship between the oscillation frequency f and the power source voltage Vb of an oscillation circuit 100X according to a comparative example shown in FIG. 5.

Figure 5:
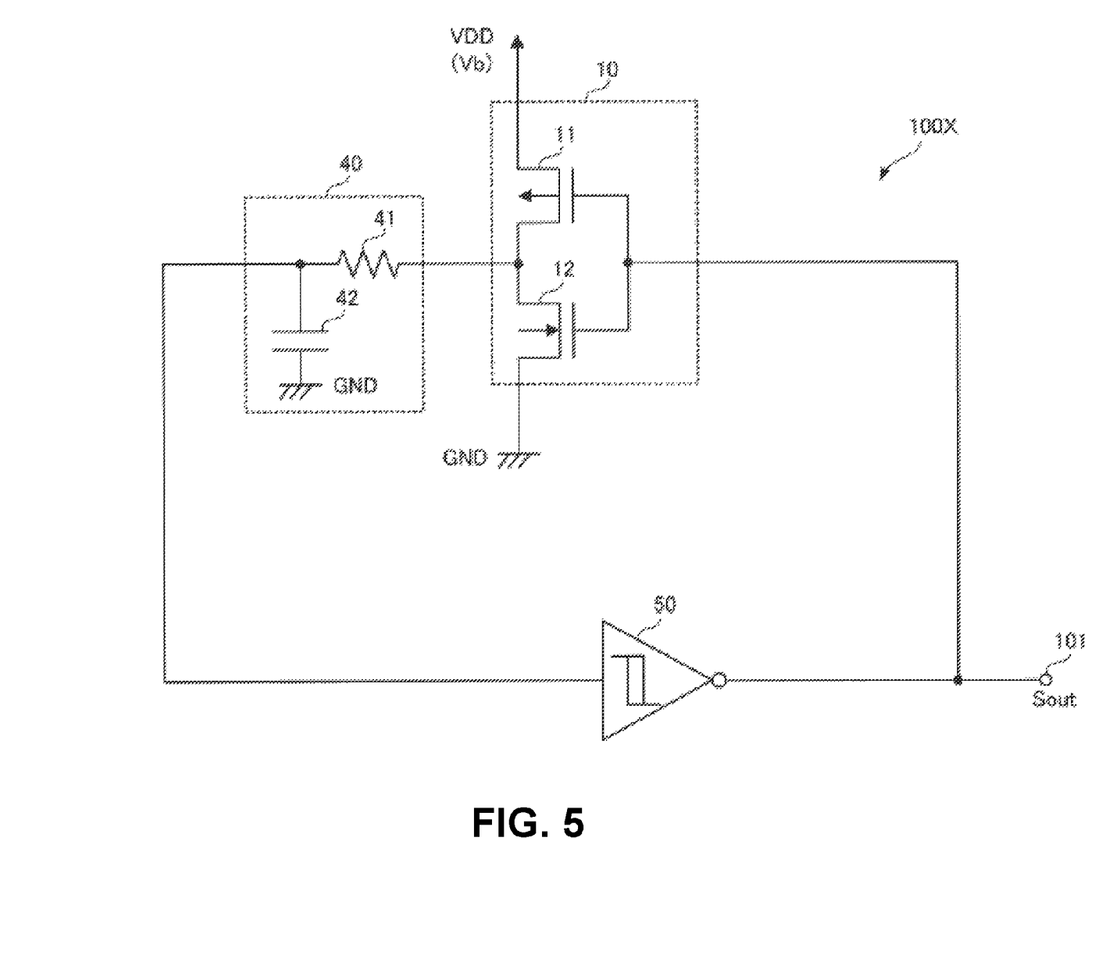
FIG. 5 is a circuit diagram showing a configuration of an oscillation circuit according to a comparative example.

FIG. 5 is a circuit diagram showing a configuration of the oscillation circuit 100X according to the comparative example. As shown in FIG. 5, in the comparative example, different from the oscillation circuit 100 in the first embodiment, the oscillation circuit 100X does not include the N-MOS transistor 20 and the control voltage generating circuit 30.

In FIG. 4, a curve "c" represents an upper limit of a clock frequency of a functional circuit (not shown) that can follow. It is supposed that the functional circuit is configured to operate according to the output signal Sout output from the oscillation circuit 100 in the first embodiment or the oscillation circuit 100X in the comparative example as the clock signal. Further, it is supposed that the functional circuit is configured to operate with the same power source as that of the oscillation circuit 100 in the first embodiment or the oscillation circuit 100X in the comparative example.

In general, the functional circuit tends to lower an operation speed thereof as the power source voltage Vb is decreased. Accordingly, as the curve "c" shows, the upper limit of the clock frequency of the functional circuit that can follow is decreased as the power source voltage Vb is decreased. Further, as the curve "b" shows, the oscillation frequency f and the power source voltage Vb of the oscillation circuit 100X is decreased as the power source voltage Vb is decreased. This is because the charging electrical current and the discharging electrical current of the capacitor 42 are decreased as the power source voltage Vb is decreased.

In the oscillation circuit 100X in the comparative example, as indicated with the curve "b" and the curve "c" in FIG. 4, the change rate of the oscillation frequency f relative to the power source voltage Vb may become smaller than the change rate of the upper limit of the clock frequency of the functional circuit that can follow relative to the power source voltage Vb. When this happens, the oscillation frequency f of the oscillation circuit 100X may exceed the upper limit of the clock frequency of the functional circuit that can follow. In other words, as shown in FIG. 4, the functional circuit may cause an operational problem in a region where the magnitude of the power source voltage Vb becomes smaller than a voltage vb1.

On the other hand, in the oscillation circuit 100 in the first embodiment, the magnitude of the control Vc1 is decreased as the magnitude of the power source voltage Vb is decreased, and the control Vc1 is supplied to the N-MOS transistor 20. Accordingly, it is controlled such that the amplitude of the discharging electrical current of the capacitor 42 is decreased as the magnitude of the power source voltage Vb is decreased.

Therefore, in the oscillation circuit 100 in the first embodiment, it is possible to adjust the change rate of the oscillation frequency f relative to the power source voltage Vb to become greater than that of the oscillation circuit 100X in the comparative example. Accordingly, in a region where the power source voltage Vb is relatively small, it is possible to prevent the oscillation frequency f of the oscillation circuit 100 from becoming greater than the upper limit of the clock frequency of the functional circuit that can follow. As a result, it is possible to prevent the functional circuit from causing the operational problem.

A method of setting the voltage division ratio of the control voltage generating circuit 30 will be explained next. In the first embodiment, the voltage division ratio of the control voltage generating circuit 30 is set, for example, during an inspection process of the oscillation circuit 100 through the following steps.

In the inspection process, an inspection device (not shown) is set up to supply the power source voltage Vb between the power source line VDD and the ground line GND of the oscillation circuit 100. In this state, the inspection device supplies the selection signal SEL1 to the control voltage generating circuit 30, so that the switches SW1 to SW4 are sequentially turned on. When the switches SW1 to SW4 are selectively turned on, the voltage division ratio of the control voltage generating circuit 30 is changed, so that the magnitude of the control voltage Vc1 is changed. As a result, the amplitude of the electrical current flowing into the N-MOS transistor 20, that is, the discharging electrical current from the capacitor 42, is changed, thereby changing the oscillation frequency f of the output signal Sout. The inspection device is arranged to measure the oscillation frequency f in each state when the switches SW1 to SW4 are sequentially turned on.

In the inspection process, the inspection device is configured to identify one of the switches SW1 to SW4 that, when being turned on, the oscillation frequency f becomes most close to a target frequency ft. In the next step, the inspection device generates the selection signal SEL1 for selecting the one of the switches SW1 to SW4, and supplies the selection signal SEL1 to the control voltage generating circuit 30. Accordingly, the selection circuit 33 of the control voltage generating circuit 30 turns on the one of the switches SW1 to SW4 according to the selection signal SEL1 supplied from the inspection device. After the inspection process is completed, the selection circuit 33 of the control voltage generating circuit 30 continues to maintain the on state of the one of the switches SW1 to SW4. As a result, it is possible to set the voltage division ratio of the control voltage generating circuit 30.

As described above, in the oscillation circuit 100 in the first embodiment, it is possible to set the voltage division ratio of the control voltage generating circuit 30 according to the measurement result of the oscillation frequency f of the output signal Sout. Accordingly, it is possible to minimize the fluctuation of the oscillation frequency f caused by a variance in characteristics of the transistors constituting the oscillation circuit 100.

In the first embodiment, it should be noted that the voltage division ratio of the control voltage generating circuit 30 may be set with other method. For example, in the inspection process, the voltage division ratio of the control voltage generating circuit 30 may be set according to the characteristics of the transistors constituting the oscillation circuit 100 such that the oscillation frequency f becomes most close to the target frequency ft. When the characteristics of the transistors constituting the oscillation circuit 100 are measured in advance, the voltage division ratio of the control voltage generating circuit 30 may be set according to the measurement results of the characteristics of the transistors.

As described above, in the oscillation circuit 100 in the first embodiment, it is configured such that the control voltage Vc1 is supplied to the gate of the N-MOS transistor 20, and the magnitude of the control voltage Vc1 is decreased as the magnitude of the power source voltage Vb is decreased. As a result, it is controlled that the amplitude of the discharging electrical current of the capacitor 42 is decreased as the magnitude of the power source voltage Vb is decreased. Accordingly, it is possible to increase the change rate of the oscillation frequency f relative to the power source voltage Vb as opposed to that of the oscillation circuit 100X in the comparative example. In other words, in the oscillation circuit 100 in the first embodiment, it is possible to prevent the functional circuit from causing the operational problem even when the oscillation circuit 100 is provided for supplying the clock signal to the functional circuit that has propensity of lowering the follow ability relative to the clock signal as the power source voltage is decreased.

Further, in the oscillation circuit 100 in the first embodiment, it is configured such that one of the switches SW1 to SW4 that is to be turned on is selected according to the selection signal SEM. Accordingly, it is possible to adjust the voltage division ratio of the control voltage generating circuit 30. When the voltage division ratio of the control voltage generating circuit 30 is adjusted, the magnitude of the control voltage Vc1 is adjusted. Accordingly, it is possible to adjust the oscillation frequency f of the output signal Sout. In other words, in the oscillation circuit 100 in the first embodiment, it is possible to minimize the fluctuation of the oscillation frequency f caused by the variance in the characteristics of the transistors constituting the oscillation circuit 100 through adjusting the voltage division ratio of the control voltage generating circuit 30.

Further, in the oscillation circuit 100 in the first embodiment, the control voltage generating circuit 30 is disposed between the power source line VDD and the ground line GND as one single path circuit, and the N-MOS transistor 20 is connected to the N-MOS transistor 12 of the inverter 10. Further, the control voltage generating circuit 30 and the N-MOS transistor 20 are arranged to realize the functions of reducing the oscillation frequency f of the output signal Sout as the power source voltage is decreased, and minimizing the fluctuation of the oscillation frequency f caused by the variance in the characteristics of the transistors constituting the oscillation circuit 100. Accordingly, it is possible to reduce power consumption as opposed to the configuration, in which an additional single path circuit is disposed between the power source line VDD and the ground line GND on the side of the P-MOS transistor 11 in addition to the side of the inverter 10 for controlling the charging electrical current and the discharging electrical current of the capacitor 42.

Second Embodiment

Figure 6:
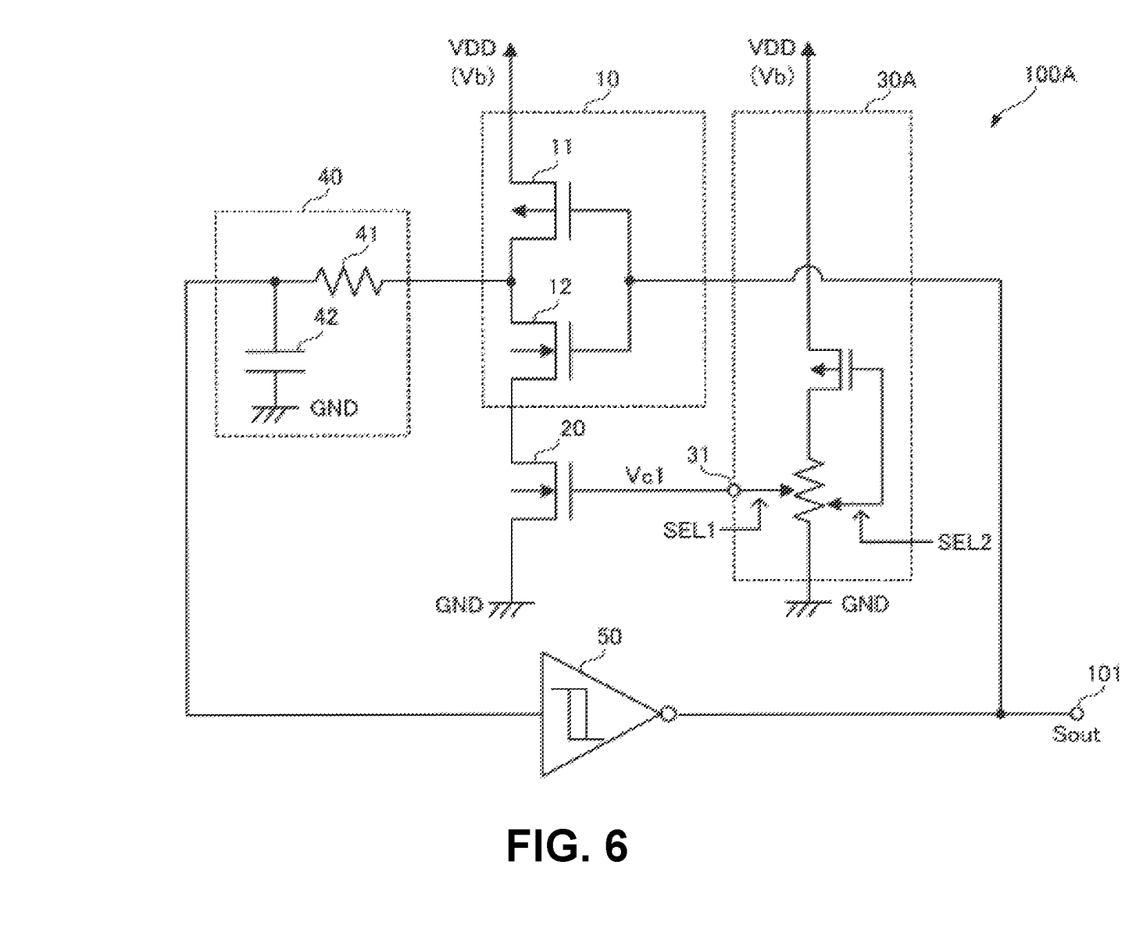
FIG. 6 is a circuit diagram showing a configuration of an oscillation circuit according to a second embodiment of the present invention.

A second embodiment of the present invention will be explained next. FIG. 6 is a circuit diagram showing a configuration of an oscillation circuit 100A according to the second embodiment of the present invention.

As shown in FIG. 6, the oscillation circuit 100A includes a control voltage generating circuit 30A having a configuration different from that of the control voltage generating circuit 30 of the oscillation circuit 100 in the first embodiment.

In the second embodiment, similar to the control voltage generating circuit 30 in the first embodiment, the control voltage generating circuit 30A is configured to generate the control voltage Vc1 having the magnitude corresponding to the power source voltage Vb supplied between the power source line VDD and the ground line GND. Further, the control voltage generating circuit 30A is configured to output and supply the control voltage Vc1 to the gate of the N-MOS transistor 20 through the output terminal 31.

Figure 7:
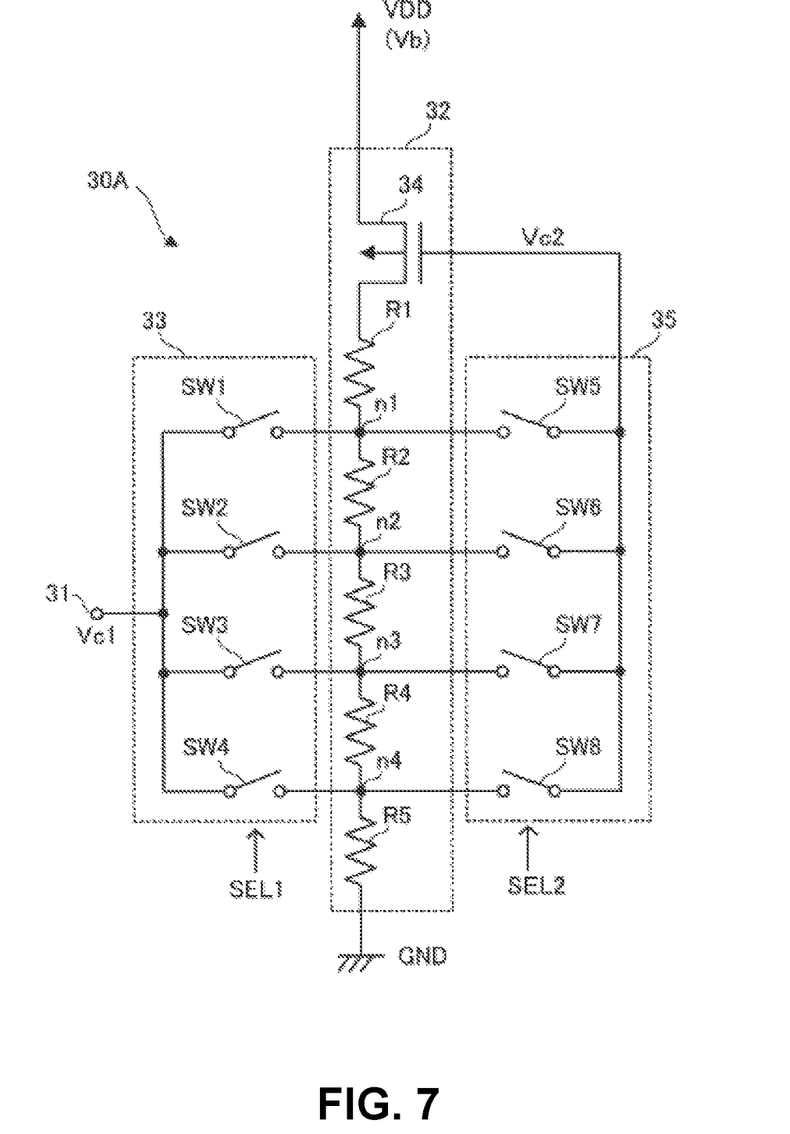
FIG. 7 is a circuit diagram showing a configuration of a control voltage generating circuit of the oscillation circuit according to the second embodiment of the present invention.

More specifically, similar to the control voltage generating circuit 30 in the first embodiment, the control voltage generating circuit 30A includes the voltage dividing circuit 32 formed of a plurality of resistor elements (refer to FIG. 7). The voltage dividing circuit 32 is configured to divide the power source voltage Vb, so that the control voltage generating circuit 30A generates the divided voltage as the control voltage Vc1. It should be noted that the selection signal SEL2 and a selection signal SEL1 are supplied externally to the control voltage generating circuit 30A, so that the control voltage generating circuit 30A can adjust the voltage division ratio for dividing the power source voltage Vb.

FIG. 7 is a circuit diagram showing a configuration of the control voltage generating circuit 30A of the oscillation circuit 100A according to the second embodiment of the present invention.

As shown in FIG. 7, different from the control voltage generating circuit 30 of the oscillation circuit 100 in the first embodiment, the control voltage generating circuit 30A further includes a P-MOS transistor 34 and a selection circuit 35. The P-MOS transistor 34 has a source connected to the power source line VDD and a drain connected to the one end portion of the resistor element R1. It should be noted that the P-MOS transistor 34 is configured to function as an element constituting the voltage dividing circuit 32.

In the second embodiment, the selection circuit 35 is formed of switches SW5, SW6, SW7, and SW8. One end portion of the switch SW5 is connected to the connection point n1 between the resistor element R1 and the resistor element R2, and one end portion of the switch SW6 is connected to the connection point n2 between the resistor element R2 and the resistor element R3. Similarly, one end portion of the switch SW7 is connected to the connection point n3 between the resistor element R3 and the resistor element R4, and one end portion of the switch SW8 is connected to the connection point n4 between the resistor element R4 and the resistor element R5. The other end portions of the switches SW1, SW2, SW3, and SW4 are connected to a gate of the P-MOS transistor 34.

In the second embodiment, it is configured such that one of the switches SW5, SW6, SW7, and SW8 is turned on according to the selection signal SEL2. Accordingly, the voltage generated at one of the connection points n1 to n4 is supplied to the gate of the P-MOS transistor 34 as the control voltage Vc2. For example, when the switch SW7 is turned on according to the selection signal SEL2, the voltage generated at the connection point n3 between the resistor element R3 and the resistor element R4 is supplied to the gate of the P-MOS transistor 34 as the control voltage Vc2. It should be noted that the control voltage Vc2 is the voltage obtained through dividing the power source voltage Vb1 at the voltage division ratio determined according to the selection signal SEL2.

In the second embodiment, the P-MOS transistor 34 is configured to function as a resistor element having a variable resistivity changing according to the magnitude of the control voltage Vc2. More specifically, the resistivity of the P-MOS transistor 34 is decreased as the magnitude of the control voltage Vc2 is decreased, so that the voltage generated at one of the connection point n1 to n4 is increased. It should be noted that the P-MOS transistor 34 is one example of a transistor of the present invention. Further, the selection circuit 33 is one example of a first selection circuit of the present invention.

As described above, similar to the oscillation circuit 100 in the first embodiment, in the oscillation circuit 100A in the second embodiment, it is possible to increase the change rate of the oscillation frequency f relative to the power source voltage Vb as opposed to that of the oscillation circuit 100X in the comparative example. Accordingly, it is possible to prevent the functional circuit from causing the operational problem even when the oscillation circuit 100A is provided for supplying the clock signal to the functional circuit that has propensity of lowering the follow ability relative to the clock signal as the power source voltage is decreased.

Further, in the oscillation circuit 100A in the second embodiment, the voltage dividing circuit 32 includes the P-MOS transistor 34 having the resistivity varying according to the selection signal SEL2. Accordingly, as compared with the oscillation circuit 100 in the first embodiment, it is possible to increase the adjustable range of the voltage division ratio in the control voltage generating circuit 30A. As a result, as compared with the oscillation circuit 100 in the first embodiment, it is possible to increase the adjustable range of the change rate of the oscillation frequency f relative to the power source voltage Vb. Therefore, it is possible to minimize the fluctuation of the oscillation frequency f caused by the variance in the characteristics of the transistors constituting the oscillation circuit 100A through adjusting the voltage division ratio of the control voltage generating circuit 30A more efficiently than the oscillation circuit 100 in the first embodiment.

Further, in the oscillation circuit 100A in the second embodiment, the control voltage generating circuit 30A is disposed between the power source line VDD and the ground line GND as one single path circuit, and the N-MOS transistor 20 is connected to the N-MOS transistor 12 of the inverter 10. Further, the control voltage generating circuit 30A and the N-MOS transistor 20 are arranged to realize the functions of reducing the oscillation frequency f of the output signal Sout as the power source voltage is decreased, and minimizing the fluctuation of the oscillation frequency f caused by the variance in the characteristics of the transistors constituting the oscillation circuit 100A. Accordingly, it is possible to reduce power consumption as opposed to the configuration, in which an additional single path circuit is disposed between the power source line VDD and the ground line GND on the side of the P-MOS transistor 11 in addition to the side of the inverter 10 for controlling the charging electrical current and the discharging electrical current of the capacitor 42.

Third Embodiment

Figure 8:
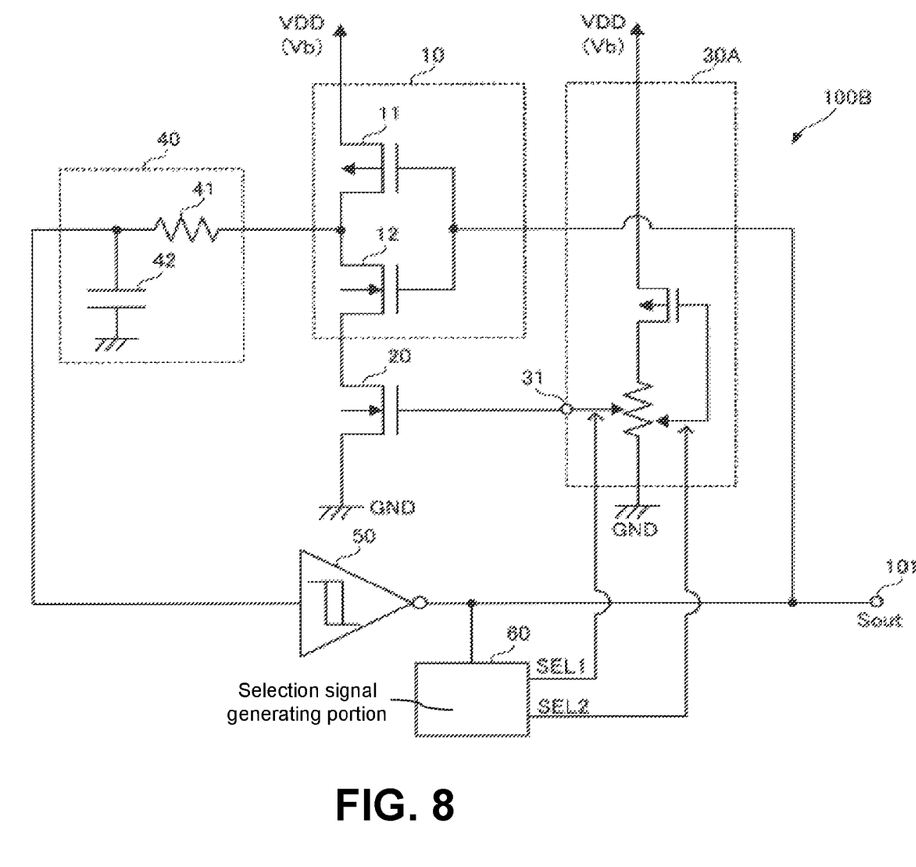
FIG. 8 is a circuit diagram showing a configuration of an oscillation circuit according to a third embodiment of the present invention.

A third embodiment of the present invention will be explained next. FIG. 8 is a circuit diagram showing a configuration of an oscillation circuit 100B according to the third embodiment of the present invention.

As shown in FIG. 8, the oscillation circuit 100B includes a selection signal generating portion 60 in addition to the configuration of the oscillation circuit 100A in the second embodiment.

In the third embodiment, the selection signal generating portion 60 is configured to generate the selection signal SEL1 and the selection signal SEL2 for setting the voltage division ratio of the control voltage generating circuit 30A. The selection signal generating portion 60 may be formed of, for example, a micro computer and a memory, so that the selection signal generating portion 60 executes a selection signal generating program stored in the memory to generate the selection signal SEL1 and the selection signal SEL2. It should be noted that the selection signal generating portion 60 is one example of a selection generating portion of the present invention.

Figure 9:
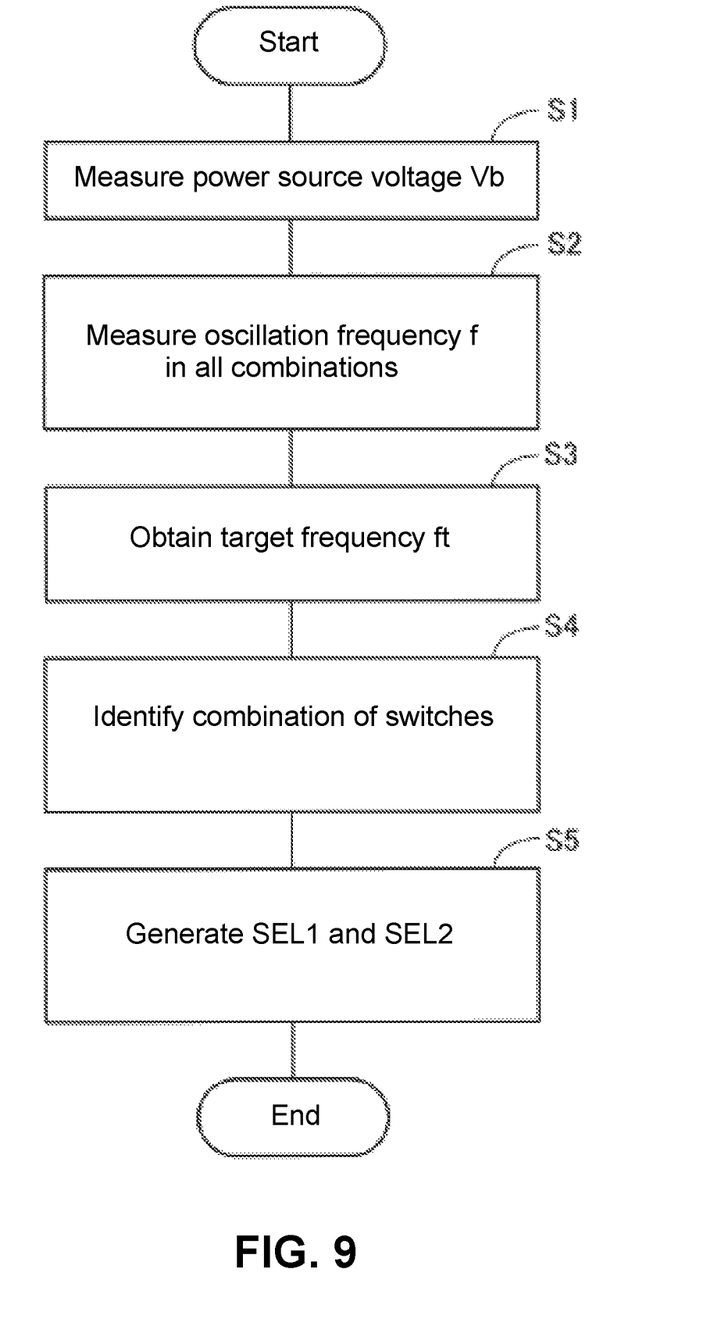
FIG. 9 is a flow chart showing an operation of the oscillation circuit in a selection signal generating process according to the third embodiment of the present invention.

An operation of the oscillation circuit 100B will be explained next. FIG. 9 is a flow chart showing the operation of the oscillation circuit 100B in a selection signal generating process according to the third embodiment of the present invention. It should be noted that the selection signal generating portion 60 executes the selection signal generating program when, for example, the oscillation circuit 100B is turned on.

In step S1, the selection signal generating portion 60 measures the power source voltage Vb supplied between the power source line VDD and the ground line GND. It should be noted that the selection signal generating portion 60 may be configured such that the selection signal generating portion 60 receives information indicating the magnitude of the power source voltage Vb from other circuit block.

In step S2, the selection signal generating portion 60 measures the oscillation frequency f of the output signal Sout in every one of all sixteen combinations in which one of the switches SW1 to SW4 is turned on and one of the switches SW5 to SW8 is turned on. Accordingly, it is possible to measure the oscillation frequency f of the output signal Sout in all sixteen combinations obtained through switching the switches SW1 to SW8. In the third embodiment, the switches SW1 to SW8 are switched when the selection signal generating portion 60 supplies the selection signal SEL1 and the selection signal SEL2 to the control voltage generating circuit 30A. It should be noted that the selection signal generating portion 60 may be configured such that the selection signal generating portion 60 obtains information indicating the oscillation frequency f in each state.

In step S3, the selection signal generating portion 60 obtains the target frequency ft of the output signal Sout relative to the power source voltage Vb measured in step S1. More specifically, the selection signal generating portion 60 may be configured to calculate the target frequency ft of the output signal Sout using, for example, an equation representing a relationship between the power source voltage Vb and the target frequency ft. Alternatively, the selection signal generating portion 60 may be configured to obtain the target frequency ft of the output signal Sout through referring a table storing a relationship between the power source voltage Vb and the target frequency ft.

In step S4, the selection signal generating portion 60 identifies the combination of the switches SW1 to SW8 corresponding to the oscillation frequency f most close to the target frequency ft obtained in step S3 the oscillation frequency f measured in all sixteen combinations of the switches SW1 to SW8.

In step S5, the selection signal generating portion 60 generates the selection signal SEL1 and the selection signal SEL2 corresponding to the combination of the switches SW1 to SW8 identified in step S4, and supplies the selection signal SEL1 and the selection signal SEL2 to the control voltage generating circuit 30A. Accordingly, the selection circuit 33 of the control voltage generating circuit 30A turns on one of the switches SW1 to SW4 thus selected according to the selection signal SEL1 supplied from the selection signal generating portion 60.

Further, the selection circuit 35 of the control voltage generating circuit 30A turns on one of the switches SW5 to SW8 thus selected according to the selection signal SEL2 supplied from the selection signal generating portion 60. After the selection signal generating process described above is completed, as long as the power source voltage Vb is supplied to the oscillation circuit 100B, the selection signal generating portion 60 continues to output the selection signal SEL1 and the selection signal SEL2, so that the voltage division ratio of the control voltage generating circuit 30A is maintained.

As described above, in the oscillation circuit 100B in the third embodiment, the selection signal generating portion 60 generates the selection signal SEL1 and the selection signal SEL2 according to the power source voltage Vb and the oscillation frequency f of the output signal Sout when the oscillation circuit 100B is turned on. Accordingly, it is possible to optimize the voltage division ratio of the control voltage generating circuit 30A according to the variance in the transistors constituting the oscillation circuit 100B and an operational environment of the oscillation circuit 100B.

In the explanation described above, the voltage division ratio of the control voltage generating circuit 30A is set when the oscillation circuit 100B is turned on. Alternatively, the selection signal generating portion 60 may be configured such that the voltage division ratio of the control voltage generating circuit 30A is set during a period of time when the oscillation circuit 100B is operating.

Figure 10:
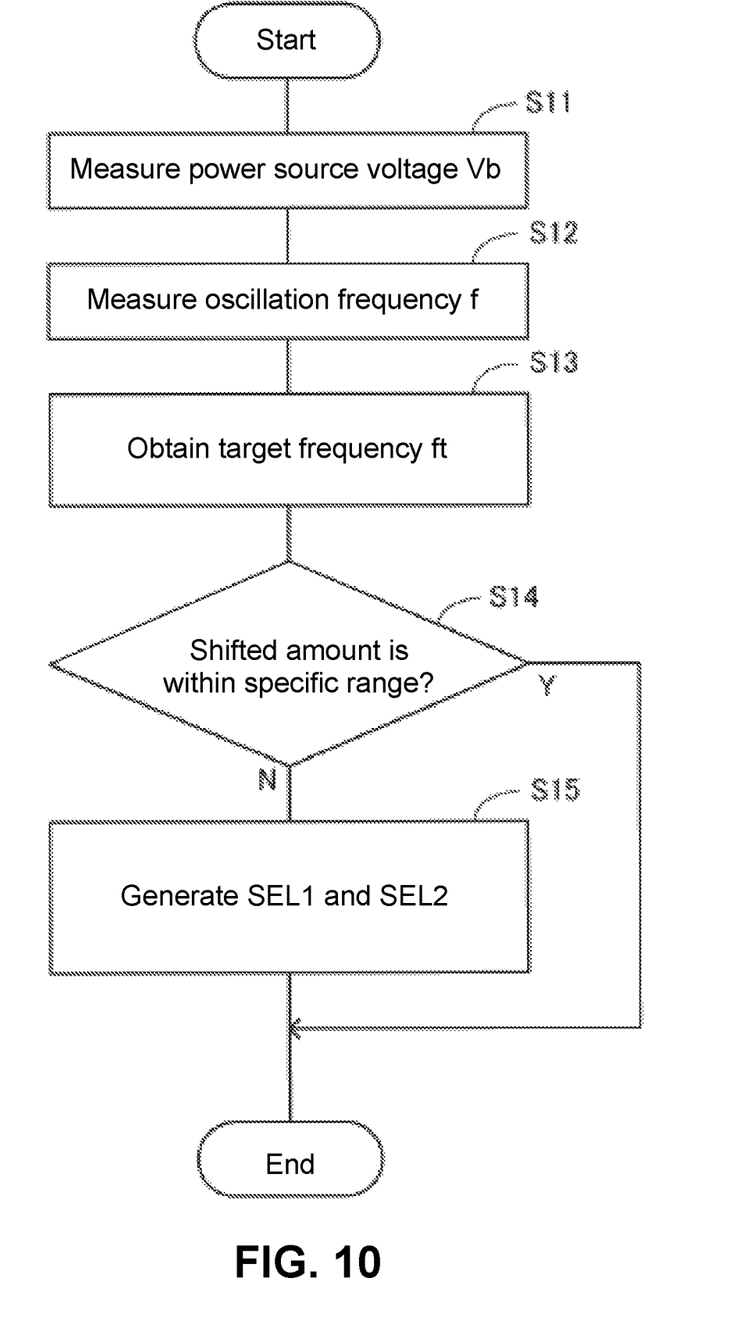
FIG. 10 is a flow chart showing the operation of the oscillation circuit in the selection signal generating process according to the third embodiment of the present invention.

FIG. 10 is a flow chart showing the operation of the oscillation circuit 100B in the selection signal generating process according to the third embodiment of the present invention. It should be noted that the selection signal generating portion 60 executes a second selection signal generating program at specific timings after, for example, the oscillation circuit 100B is turned on.

In step S11, the selection signal generating portion 60 measures the power source voltage Vb supplied between the power source line VDD and the ground line GND. It should be noted that the selection signal generating portion 60 may be configured such that the selection signal generating portion 60 receives information indicating the magnitude of the power source voltage Vb from other circuit block.

In step S12, the selection signal generating portion 60 measures the oscillation frequency f of the output signal Sout. It should be noted that the selection signal generating portion 60 may be configured such that the selection signal generating portion 60 obtains information indicating the oscillation frequency f of the output signal Sout from other circuit block.

In step S13, the selection signal generating portion 60 obtains the target frequency ft of the output signal Sout relative to the power source voltage Vb measured in step S11. More specifically, the selection signal generating portion 60 may be configured to calculate the target frequency ft of the output signal Sout using, for example, an equation representing a relationship between the power source voltage Vb and the target frequency ft. Alternatively, the selection signal generating portion 60 may be configured to obtain the target frequency ft of the output signal Sout through referring a table storing a relationship between the power source voltage Vb and the target frequency ft.

In step S14, the selection signal generating portion 60 determines whether the oscillation frequency f measured in step S12 is shifted from the target frequency ft by an amount within a specific range.

When the selection signal generating portion 60 determines that the oscillation frequency f measured in step S12 is shifted from the target frequency ft by an amount within the specific range, the process is completed without changing the voltage division ratio of the control voltage generating circuit 30A. On the other hand, when the selection signal generating portion 60 determines that the oscillation frequency f measured in step S12 is shifted from the target frequency ft by an amount outside the specific range, the process proceeds to step S15.

In step S15, the selection signal generating portion 60 generates the selection signal SEL1 and the selection signal SEL2 such that the oscillation frequency f measured in step S12 is shifted from the target frequency ft by a less amount. Then, the selection signal generating portion 60 supplies the selection signal SEL1 and the selection signal SEL2 to the control voltage generating circuit 30A. Accordingly, the selection circuit 33 of the control voltage generating circuit 30A switches the switches SW1 to SW8 according to the selection signal SEL1 and the selection signal SEL2 supplied from the selection signal generating portion 60. As a result, the voltage division ratio of the control voltage generating circuit 30A is properly adjusted.

As described above, in the third embodiment, the selection signal generating portion 60 updates the selection signal SEL1 and the selection signal SEL2 according to the power source voltage Vb and the oscillation frequency f during a period of time when the oscillation circuit 100B is operating. Accordingly, it is possible to optimize the voltage division ratio of the control voltage generating circuit 30A while following the change in an operational environment and the like during a period of time when the oscillation circuit 100B is operating.

In the third embodiment, the selection signal generating portion 60 is applied to the oscillation circuit 100A in the second embodiment. Alternatively, the selection signal generating portion 60 may be applied to the oscillation circuit 100 in the first embodiment.

Further, in the first to third embodiments, the N-MOS transistor 20 is used as the electrical current control portion for controlling the amplitude of the discharging electrical current of the capacitor 42, and the present invention is not limited thereto. For example, a variable resistivity circuit whose resistivity is varying according to the magnitude of the control voltage Vc1 may be used instead of the N-MOS transistor 20. In this case, the variable resistivity circuit is disposed on the path through which the discharging electrical current is flowing, so that the resistivity of the variable resistivity circuit is increased as the magnitude of the control voltage Vc1 is decreased.

The disclosure of Japanese Patent Application No. 2014-251484, filed on Dec. 12, 2014, is incorporated in the application by reference.

While the invention has been explained with reference to the specific embodiments of the invention, the explanation is illustrative and the invention is limited only by the appended claims.

What is claimed is:
1. An oscillation circuit, comprising:
   an electrical current generating portion configured to generate an electrical current having an oscillation frequency decreasing as an amplitude thereof is decreased, said electrical current generating portion including an inverter having a first input terminal and a first output terminal, said inverter configured to invert a level of a voltage input into the first input terminal so that the inverter outputs the voltage from the first output terminal;
   a control voltage generating portion configured to generate a control voltage having a magnitude decreasing as a magnitude of a power source voltage is decreased;
   an RC circuit connected to the first output terminal of the inverter, said RC circuit including a capacitor charging or discharging the electrical current;
   a Schmitt trigger circuit configured to receive a terminal voltage from the capacitor as an input voltage, and to supply an output voltage to the first input terminal of the inverter; and
   an electrical current control portion, wherein said electrical current control portion includes a second input terminal connected to the electrical current generating portion for receiving the electrical current; a control terminal connected to the control voltage generating portion for receiving the control voltage; and a second output terminal, and said electrical current control portion is configured to reduce the amplitude of the electrical current flowing between the second input terminal and the second output terminal as the magnitude of the control voltage is decreased.

2. The oscillation circuit according to claim 1, wherein said control voltage generating portion includes a plurality of resistor elements connected in series for receiving the power source voltage, and said control voltage generating portion further includes a first selection circuit for selectively connecting one of connection points between the resistor elements to the control terminal of the electrical current control portion according to a first selection signal.

3. The oscillation circuit according to claim 2, wherein said control voltage generating portion further includes a first transistor connected in series to the resistor elements, and said control voltage generating portion further includes a second selection circuit for selectively connecting one of the connection points between the resistor elements to a gate of the first transistor according to a second selection signal.

4. The oscillation circuit according to claim 3, further comprising a second selection signal generating portion for generating the first selection signal and the second selection signal.

5. The oscillation circuit according to claim 4, wherein said second selection signal generating portion is configured to generate the first selection signal and the second selection signal so that the oscillation frequency is maintained within a specific range according to the magnitude of the power source voltage.

6. The oscillation circuit according to claim 2, further comprising a first selection signal generating portion for generating the first selection signal.

7. The oscillation circuit according to claim 6, wherein said first selection signal generating portion is configured to generate the first selection signal so that the oscillation frequency is maintained within a specific range according to the magnitude of the power source voltage.

8. An oscillation circuit, comprising:
a first P-MOS transistor having a source connected to a power source line;
a first N-MOS transistor having a drain connected to a drain of the first P-MOS transistor and a gate connected to a gate of the first P-MOS transistor;
a second N-MOS transistor having a drain connected to the source of the first N-MOS transistor and a source connected to a ground line;
an RC circuit having a capacitor charging or discharging an electrical current;
a Schmitt trigger circuit configured to receive a terminal voltage from the capacitor as an input voltage, and to supply an output voltage; and
a control voltage generating portion configured to supply a control voltage to a gate of the second N-MOS transistor, said control voltage having a magnitude decreasing as a magnitude of a power source voltage supplied between the power source line and the ground line is decreased.

9. The oscillation circuit according to claim 8, wherein said control voltage generating portion includes a plurality of resistor elements connected in series and disposed between the power source line and the ground line, and said control voltage generating portion further includes a first selection circuit for selectively connecting one of connection points between the resistor elements to the gate of the second N-MOS transistor according to a first selection signal.

10. The oscillation circuit according to claim 9, wherein said control voltage generating portion further includes a second P-MOS transistor connected between the resistor elements and the power source line, and said control voltage generating portion further includes a second selection circuit for selectively connecting one of the connection points between the resistor elements to a gate of the second P-MOS transistor according to a second selection signal.

* * * * *